(12) United States Patent
Jakschik et al.

(10) Patent No.: US 7,842,559 B2
(45) Date of Patent: Nov. 30, 2010

(54) METHOD OF FABRICATING MULTI-GATE SEMICONDUCTOR DEVICES WITH IMPROVED CARRIER MOBILITY

(75) Inventors: Stefan Jakschik, Dresden (DE); Nadine Collaert, Blanden (BE)

(73) Assignee: IMEC, Leuven (BE)

( * ) Notice: Subject to any disclaimer, the term of this patent is extended or adjusted under 35 U.S.C. 154(b) by 62 days.

(21) Appl. No.: 12/340,302

(22) Filed: Dec. 19, 2008

(65) Prior Publication Data

US 2009/0159972 A1 Jun. 25, 2009

Related U.S. Application Data

(60) Provisional application No. 61/015,135, filed on Dec. 19, 2007.

(30) Foreign Application Priority Data

Mar. 29, 2008 (EP) .................. 08153677

(51) Int. Cl.
*H01L 21/00* (2006.01)
*H01L 21/84* (2006.01)

(52) U.S. Cl. .............. 438/150; 438/198; 438/269; 438/479

(58) Field of Classification Search .......... 438/150, 438/198, 269, 479
See application file for complete search history.

(56) References Cited

U.S. PATENT DOCUMENTS

| | | | |
|---|---|---|---|
| 6,835,618 B1 | 12/2004 | Dakshina-Murthy et al. | |
| 7,291,886 B2 * | 11/2007 | Doris et al. | 257/350 |
| 7,439,109 B2 * | 10/2008 | Anderson et al. | 438/150 |
| 7,595,232 B2 * | 9/2009 | Kim et al. | 438/198 |
| 2005/0199984 A1 | 9/2005 | Nowak | |
| 2005/0224875 A1 | 10/2005 | Anderson et al. | |
| 2005/0280121 A1 | 12/2005 | Doris et al. | |

(Continued)

FOREIGN PATENT DOCUMENTS

JP 2002 289871 4/2002

(Continued)

OTHER PUBLICATIONS

Extended European Search Report dated Sep. 4, 2008 for EP Application No. 08153677.3.

(Continued)

*Primary Examiner*—Charles D Garber
*Assistant Examiner*—Bryan R Junge
(74) *Attorney, Agent, or Firm*—Knobbe Martens Olson & Bear LLP

(57) ABSTRACT

A method of fabricating a multi-gate device is disclosed. In one aspect, the method includes providing a substrate having a first semiconductor layer with a first carrier mobility enhancing parameter, an insulating layer, a second semiconductor layer with a second carrier mobility enhancing parameter different from the first carrier mobility enhancing parameter. A first and second dielectric layer are then provided on the substrate. A first trench is formed in a first active region through the dielectric layers, the second semiconductor layer and the buried insulating layer. A first fin is formed in the first trench, protruding above the first dielectric layer and having the first carrier mobility enhancing parameter. A second trench is formed in a second active region through the dielectric layers. A second fin is formed in the second trench, protruding above the first dielectric layer and having the second mobility enhancing parameter.

17 Claims, 7 Drawing Sheets

U.S. PATENT DOCUMENTS

| | | |
|---|---|---|
| 2006/0214226 A1 | 9/2006 | Chen et al. |
| 2007/0166891 A1 | 7/2007 | Park |
| 2007/0218628 A1 | 9/2007 | Orlowski et al. |
| 2007/0235818 A1 | 10/2007 | Anderson et al. |
| 2007/0281446 A1 | 12/2007 | Winstead et al. |
| 2008/0227241 A1* | 9/2008 | Nakabayashi et al. ....... 438/150 |

OTHER PUBLICATIONS

Yang et al., Hybrid-Orientation Technology (HOT): Opportunities and Challenges, IEEE Transactions on Electron Devices, May 2006, vol. 53, No. 5.

* cited by examiner

METHOD OF FABRICATING MULTI-GATE SEMICONDUCTOR DEVICES WITH IMPROVED CARRIER MOBILITY

CROSS REFERENCE TO RELATED APPLICATIONS

This application claims priority under 35 U.S.C. §119(e) to U.S. provisional patent application 61/015,135 filed on Dec. 19, 2007, which application is hereby incorporated by reference in its entirety.

BACKGROUND OF THE INVENTION

1. Field of the Invention

The present invention generally relates to semiconductor fabrication and more particularly to methods for forming multi-gate devices and the multi-gate devices made thereof.

More specifically, this invention relates to methods for forming multi-gate devices with improved carrier mobility.

2. Description of the Related Technology

Scaling down of silicon MOS devices has become a major challenge in the semiconductor industry. Whereas at the beginning, device geometrical shrinking already gave a lot of improvements in IC performance, nowadays new techniques, methods, materials and device architectures have to be introduced beyond the 90 nm technology node.

One major problem when scaling conventional planar devices are the short channel effects which start to dominate over the device performance. A solution for this problem came with the introduction of the multi-gate field effect transistor (MUGFET), also often referred to as fin-based semiconductor device or FINFET. Due to their three dimensional architecture, with the gate being wrapped around a thin semiconductor fin, an improved gate control (and thus less short channel effects) over the channel could be achieved by using multiple gates.

However, the introduction of this new device architecture has caused new problems. One of them is the insufficient mobility of the carriers in the device. The integration of a multi-gate pMOSFET (also referred to as pFINFET) and a multi-gate nMOSFET (also referred to as nFINFET) on one wafer is not straightforward, due to the fact that the mobility of electrons and holes occur preferentially along different crystal directions within the silicon crystal structure. Due to the parallel distribution of the pFINFET and the nFINFET on the wafer, i.e. both types of FINFET will be oriented along the same direction with respect to the crystal orientation of the wafer, either one of these two device types will not have the optimum channel direction and orientation, and hence will not have the optimum carrier mobility.

In case of silicon for example, the electron mobility is highest on a (100) substrate, with <110> channel direction (current direction), referred to as (100)/<110> orientation/direction or shortly (100)/<110>. The electron mobility is lowest on a (110) substrate, with <110> channel direction (current direction), referred to as (110)/<110> orientation/direction or shortly (110)/<110>. The hole mobility, however, is highest in the (110)/<110> orientation/direction, while it is lowest in the (100)/<110> orientation/direction.

For example in U.S. Patent Application US2004/0119100, pFINFET and nFINFET are made on the same substrate. The pFINFETs and nFINFETs for the multi-gate device are oriented at a first and second azimuthal angle respectively with respect to the axis orientation of the semiconductor wafer. The fin bodies of the pFINFET are thus oriented at an angle so that the resulting channel regions are along the {110} plane, while the fin bodies of the nFINFET are oriented at an angle so that the resulting channel regions are along the {100} plane. In silicon the {100} and {110} planes are oriented at 45 degrees with respect to one another, such that the fin bodies are likewise oriented at 45 degrees with respect to one another. However the enhancement in mobility is at the expense of the layout efficiency. Also manufacturing cost is increased due to the design complexity.

Additionally, in case of a multi-gate device, the top surface and sidewall surfaces orientation/direction play an important role for the mobility of the device. In case of a multi-gate device fabricated on a standard SOI (Silicon On Insulator) substrate with (100)/<110> orientation/direction, the top surface of the fin has (100)/<110> orientation/direction, while the sidewall surfaces of the fin have (110)/<110> orientation/direction. Therefore, it is beneficial to shape the nFINFET small and broad in order to maximize the top surface area and to shape the pFINFET tall and narrow to maximize the sidewall surfaces area. Hence, when using one substrate with one crystallographic orientation, a different geometry of n-type and p-type MUGFETs is required if the mobility of electron and holes is to be optimized simultaneously.

Although already some possibilities are available in the state-of-the-art for enhancing the mobility in multi-gate semiconductor devices, there is a need for other mobility enhancement techniques for multi-gate devices combine both an increased mobility for the p-type and the n-type MUGFET.

SUMMARY OF CERTAIN INVENTIVE ASPECTS

Certain inventive aspects of the present invention relates to a method to enhance the mobility in a multi-gate device by combining an increased mobility for the p-type multi-gate device transistor with an increased mobility for the n-type multi-gate device transistor.

One inventive aspect relates to a method for fabricating a multi-gate device, the method comprising providing a substrate, the substrate comprising a first semiconductor layer having at least a first carrier mobility enhancing parameter, a buried insulating layer on the first semiconductor layer, a second semiconductor layer having at least a second carrier mobility enhancing parameter on the buried insulating layer, the second carrier mobility enhancing parameter being different from the first carrier mobility enhancing parameter; defining a first active region and a second active region in the substrate, the first active region being electrically isolated from the second active region; providing a first dielectric layer on the substrate; providing a second dielectric layer on the first dielectric layer; forming in the first active region at least a first trench through the first dielectric layer, the second dielectric layer, the second semiconductor layer and the buried insulating layer; forming a first fin in the at least first trench, the first fin protruding above the first dielectric layer, the first fin having at least the first carrier mobility enhancing parameter; forming in the second active region at least a second trench through the first dielectric layer and the second dielectric layer; forming a second fin in the at least second trench, the second fin protruding above the first dielectric layer, the second fin comprising at least the second mobility enhancing parameter; removing the second dielectric layer to expose the first fin and the second fin.

It is an advantage of certain inventive aspects according to the present invention that both the mobility of a first fin and the mobility of a second fin may be enhanced. It is an advantage of certain inventive aspects according to the present invention that the mobility of a first active region with a first fin may be enhanced without degradation of the mobility of a second active region with a second fin. It is another advantage of certain inventive aspects according to the present invention that at least a first fin and at least a second fin may be fabricated starting from a substrate, the substrate comprising at least two semiconductor layers wherein the semiconductor layers have different carrier mobility enhancing parameters.

The first carrier mobility enhancing parameter and the second carrier mobility enhancing parameter can be created by any of a crystalline orientation or a crystalline direction or a semiconductor material or a stress or a combination thereof.

In case of a carrier mobility enhancing parameter comprising a crystalline orientation and/or crystalline direction, the crystalline orientation is chosen from (100), (110), (111) and/or the crystalline direction (channel direction or current direction) is chosen from <100>, <110>, <111>. Possible combinations are for example a (100)/<110> semiconductor material, a (110)/<110> semiconductor material, a (110)/<100> semiconductor material, a (110)/<110> semiconductor material. Also a (111)/<112> semiconductor material may be chosen for the first or second semiconductor layer.

It is an advantage of certain inventive aspects of the present invention that mobility of a multi-gate device may be improved through wafer and channel orientation optimization. More specifically by choosing the appropriate channel direction/orientation of the first and the second semiconductor layer, the mobility of the first fin in the first active region (grown on the first semiconductor layer) may be enhanced without degrading the mobility of the second fin in the second active region (grown on the second semiconductor layer).

The semiconductor material is preferably crystalline, semi-crystalline or poly-crystalline. The semiconductor material may be Si, SiGe, SiC, Ge, a III-V material.

It is an advantage of certain inventive aspects of the present invention that mobility of a multi-gate device may be improved through the semiconductor material optimization. More specifically by choosing the appropriate semiconductor material for the first semiconductor layer (and thus the first fin) and the appropriate semiconductor material for the second semiconductor layer (and thus the second fin), the mobility of the first fin may be enhanced without degrading the mobility of the second fin. For example a Si n-type multi-gate transistor fin may be combined with a SiGe p-type multi-gate transistor fin starting from a substrate, the substrate may comprise at least a Si layer and a SiGe layer, the layers being located above each other and preferably separated by an buried insulating layer.

The first dielectric layer and/or the second dielectric layer may comprise any of an oxide, a nitride, amorphous carbon, a low-k dielectric material or any combination thereof.

The first active region (comprising at least a first fin) is electrically isolated from the second active region (comprising at least a second fin) by electrically isolating at least a sidewall of the first trench in the first active region from the second semiconductor layer in the second active region. Isolating a sidewall may be done by depositing a dielectric material at the sidewall of the first trench, more preferably by depositing a spacer material, such as nitride, at the sidewall of the first trench.

The second dielectric layer has a thickness T such that the first fin protrudes above the first dielectric layer over a height H1 equal or smaller than T while the second fin protrudes above the first dielectric layer over a height H2 equal or smaller than T. The height H1 may be chosen equal to height H2.

It is an advantage of certain inventive aspects of the present invention that a multi-gate device may be fabricated comprising different geometry for the at least first fin and the at least second fin. By applying a different geometry (i.e. height of the fin, width of the fin, length of the fin) for the first fin and the second fin of the multi-gate device, the mobility of the first fin may be further improved without degrading the mobility of the second fin.

The process of forming the first fin in the at least first trench further comprises filling in a bottom part of the first trench by epitaxially growing on the first semiconductor layer, a bottom semiconductor material having at least the first carrier mobility enhancing parameter. Additionally at least an upper part of the first trench may be filled by epitaxially growing on the bottom semiconductor material in the bottom part of the first trench an upper semiconductor material. The process of forming the second fin in the at least second trench may further comprise filling in a bottom part of the second trench by epitaxially growing on the second semiconductor layer another bottom semiconductor material having at least the second carrier mobility enhancing parameter. Additionally an upper part of the second trench may be filled by epitaxially growing on the another bottom semiconductor material in the bottom part of the second trench another upper semiconductor material.

The process of filling at least the bottom part of the second trench may be done preferably simultaneously with filling the upper part of the first trench.

It is an advantage of certain inventive aspects of the present invention that at least part of the fin in the first active region may be formed simultaneously with at least part of the fin in the second active region without decreasing the mobility of one of these fins.

Alternatively a mask may be provided on the at least first fin before the process of forming the at least second fin. The mask will then be removed after the process of forming the at least second fin.

It is an advantage of certain inventive aspects of the present invention that at least a first fin with an improved mobility in a first active region may be formed separately from the formation of at least a second fin with an improved mobility in the second active region.

A second inventive aspect of the present invention relates to a multi-gate device comprising a substrate, the substrate comprising a first semiconductor layer comprising a first semiconductor material with at least a first carrier mobility enhancing parameter, a buried insulating layer on the first semiconductor layer, a second semiconductor layer comprising a second semiconductor material with at least a second carrier mobility enhancing parameter on the buried insulating layer, the second carrier mobility enhancing parameter being different from the first carrier mobility enhancing parameter; a first active region and a second active region in the substrate, the first active region being electrically isolated from the second active region, wherein the first active region comprises at least a first fin, the first fin comprising at least the first semiconductor material; wherein the second active region comprises at least a second fin, the second fin comprising at least the second semiconductor material; a dielectric layer atop of the second semiconductor layer, the dielectric layer in between the at least first fin and the at least second fin, the at least first fin and the at least second fin protruding above and through the dielectric layer; a gate oxide layer on each fin; a gate electrode on the gate oxide layer; and a source region and a drain region in the active regions at sides of the gate electrode.

The first fin is grown on top and in contact with the first semiconductor layer, the first fin comprising at least the first semiconductor material. The second fin is grown on top and in contact with the second semiconductor layer.

The first carrier mobility enhancing parameter of the multi-gate device and the second carrier mobility enhancing parameter of the multi-gate device are preferably defined by choosing different crystalline orientations/directions of the first semiconductor material and second semiconductor material respectively.

More preferably at least the first fin comprises an n-type first semiconductor material having a (100)/<110> surface direction/orientation, and at least the second fin comprises a p-type second semiconductor material having a (110)/<110> surface direction/orientation.

BRIEF DESCRIPTION OF THE DRAWINGS

All drawings are intended to illustrate some aspects and embodiments of the present invention. The drawings described are only schematic and are non-limiting.

Exemplary embodiments are illustrated in referenced figures of the drawings. It is intended that the embodiments and figures disclosed herein be considered illustrative rather than restrictive. In the different figures, the same reference signs refer to the same or analogous elements.

DETAILED DESCRIPTION OF CERTAIN ILLUSTRATIVE EMBODIMENTS

Figure 1:
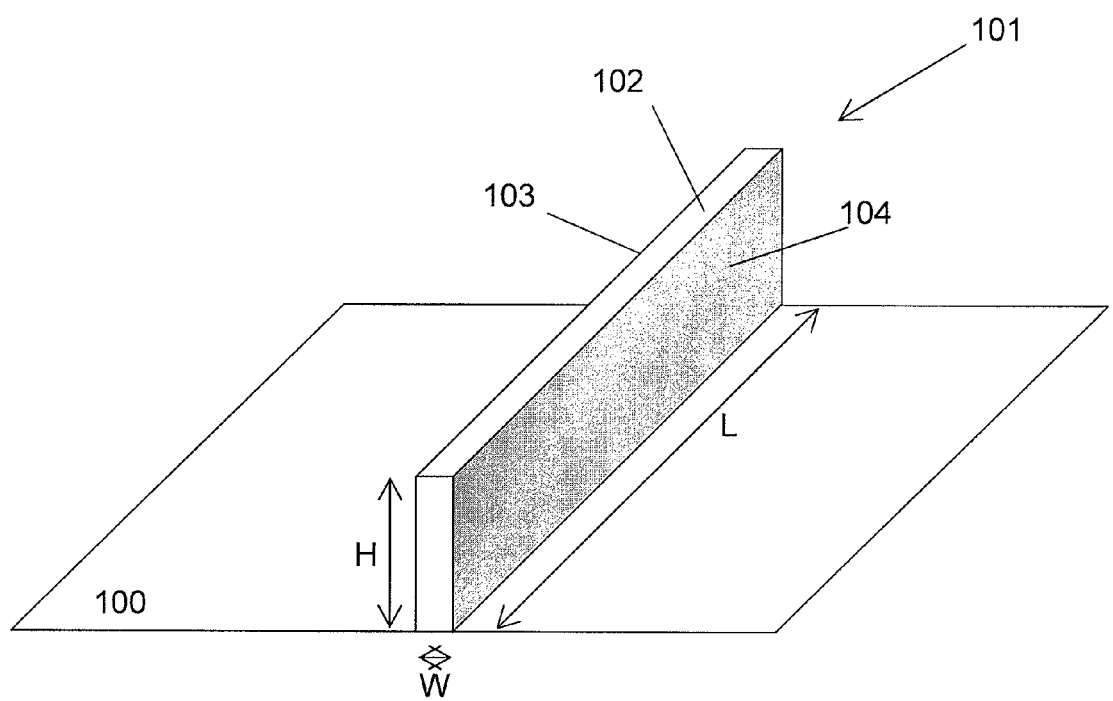
FIG. 1 is a schematic representation of a 3-dimensional view of a fin.

One or more embodiments of the present invention will now be described in detail with reference to the attached figures, the invention is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope. Accordingly, the description of certain embodiments should not be deemed to limit the scope of the present invention.

Furthermore, the terms first, second and the like in the description and in the claims are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein. For example "underneath" and "above" an element indicates being located at opposite sides of this element.

It is to be noticed that the term "comprising", used in the claims, should not be interpreted as being restricted to the means listed thereafter; it does not exclude other elements or processes. Thus, the scope of the expression "a device comprising means A and B" should not be limited to devices consisting only of components A and B. It means that with respect to the present description, the only relevant components of the device are A and B.

Reference throughout this specification to "one embodiment" or "an embodiment" means that a particular feature, structure or characteristic described in connection with the embodiment is included in at least one embodiment of the present invention. Inventive aspects may lie in less than all features of a single foregoing disclosed embodiment.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the description.

Figure 2:
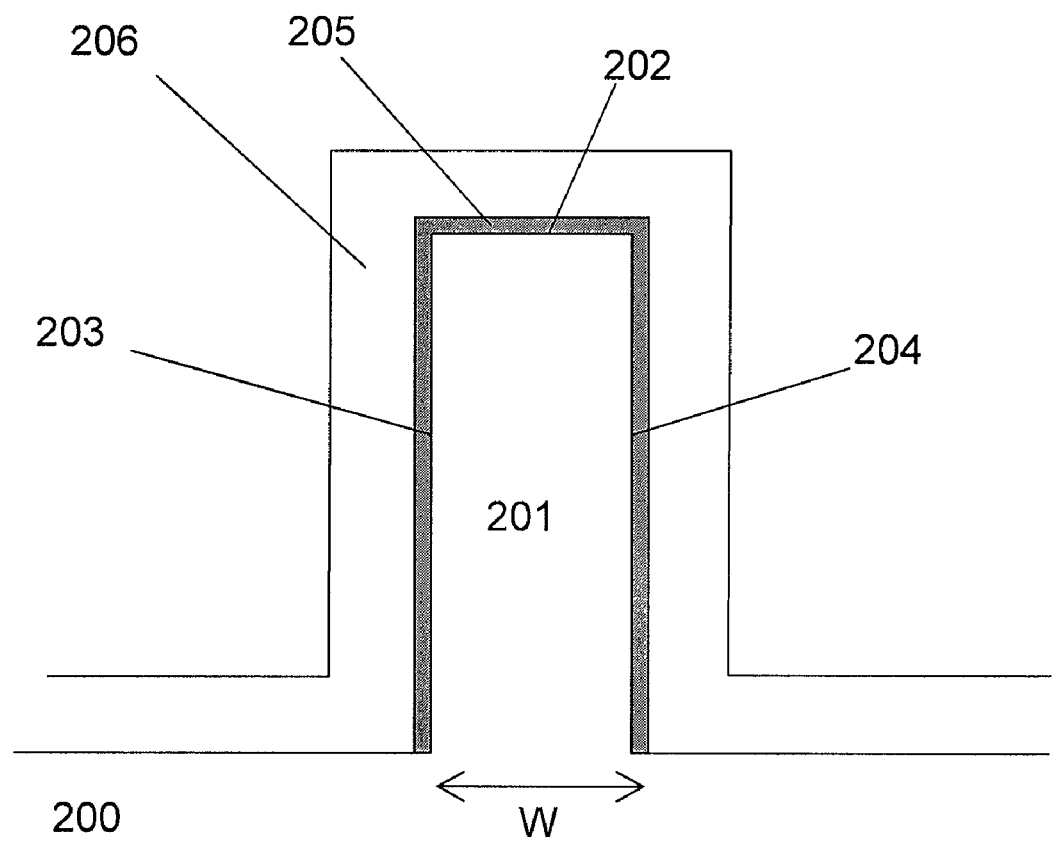
FIG. 2 represents a schematic cross-section through a fin of a multi-gate device.

A planar field effect transistor includes a channel which is in the plane of the wafer surface and a gate which is located on top of this wafer surface in the same plane as the channel. One embodiment is related to multi-gate field effect transistors (MUGFET). A MUGFET comprises a fin-like shaped channel region (also referred to as 'fin') of a semiconductor material (e.g. Si, SiGe), the fin protruding above the surface. Due to this fin-shaped body a multi-gate field effect transistor is also often referred to as a finFET device. As shown in FIG. 1, the fin 101 is raised above the wafer/substrate surface 100. The geometry of the fin 101 is determined by its width W, height H and length L and comprises a top surface 102, a first (left) sidewall surface 103 and a second (right) sidewall surface 104. As shown in FIG. 2, a cross-section through the fin 101, a gate dielectric 205 and gate electrode 206 (not shown in FIG. 1) is wrapped around the fin 201, the fin 201 being the channel region of the finFET. The fin 201 is fabricated from a semiconductor substrate 200 Depending on the shape of the gate electrode, different types of multi-gate field effect transistors can be defined. A double-gate finFET is a multi-gate transistor where the gate only controls the conductivity of the two sidewall surfaces of the fin. Such a device is also often referred to as a double-gate device. A triple-gate finFET (Tri-gate, Pi-gate, Q-gate finFET) is a multi-gate device where the gate 206 controls the conductivity of the two sidewall surfaces 203,204 and the top surface 202 of the fin. A gate dielectric 205 is sandwiched in between the gate electrode 206 and the semiconductor fin 201. A U-gate finFET is a multi-gate device where the gate controls the conductivity of the two sidewall surfaces and the bottom surface of the fin. A gate all-around (GAA) finFET is a multi-gate device where the gate controls the conductivity of the two sidewall surfaces, the top surface of the fin and the bottom surface of the fin.

A MUGFET can be fabricated on a silicon-on-insulator substrate (SOI). SOI substrates can be made in different ways, such as separation by implanted oxygen (SIMOX) or wafer bonding. Also strained silicon-on-insulator substrates (SSOI) or relaxed Si1-xGex-on-insulator (SGOI) or strained silicon directly on insulator (SDOI) or SiC-on-insulator (SiCOI) can be used. Alternatively a MUGFET can also be fabricated on bulk semiconductor material and is then referred to as bulk MUGFET.

One embodiment discloses a method for fabricating a multi-gate device comprising:

providing a substrate, the substrate comprising a first semiconductor layer having at least a first carrier mobility enhancing parameter, a buried insulating layer on the first semiconductor layer, a second semiconductor layer having at least a second carrier mobility enhancing parameter on the buried insulating layer, the second carrier mobility enhancing parameter being different from the first carrier mobility enhancing parameter.

defining a first active region and a second active region in the substrate, the first active region being electrically isolated from the second active region, providing a first dielectric layer on the substrate, providing a second dielectric layer on the first dielectric layer, forming in the first active region at least a first trench through the first dielectric layer, the second dielectric layer, the second semiconductor layer and the buried insulating layer, forming a first fin in the at least first trench, the first fin protruding above the first dielectric layer, the first fin having at least the first carrier mobility enhancing parameter, forming in the second active region at least a second trench through the first dielectric layer and the second dielectric layer, forming a second fin in the at least second trench, the second fin protruding above the first dielectric layer, the second fin comprising at least the second mobility enhancing parameter, removing the second dielectric layer to expose the first fin and the second fin.

Another embodiment also discloses a multi-gate device comprising:

a substrate, the substrate comprising a first semiconductor layer comprising a first semiconductor material with at least a first carrier mobility enhancing parameter, a buried insulating layer on the first semiconductor layer, a second semiconductor layer comprising a second semiconductor material with at least a second carrier mobility enhancing parameter on the buried insulating layer, the second carrier mobility enhancing parameter being different from the first carrier mobility enhancing parameter;

a first active region and a second active region in the substrate, the first active region being electrically isolated from the second active region, wherein the first active region comprises at least a first fin, the first fin grown on top and in contact with the first semiconductor layer, the first fin comprising at least the first semiconductor material; the first fin comprising at least the first semiconductor material;

wherein the second active region comprises at least a second fin, the second fin grown on top and in contact with the second semiconductor layer, the second fin, the second fin comprising at least the second semiconductor material;

a dielectric layer atop of the second semiconductor layer, the dielectric layer in between the at least first fin and the at least second fin, the at least first fin and the at least second fin protruding above and through the dielectric layer; a gate oxide layer on each fin; a gate electrode on the gate oxide layer; and a source region and a drain region in the active regions at sides of the gate electrode.

With reference now to FIG. 3A to FIG. 3F a manufacturing sequence according to certain embodiments of the present invention is illustrated in more detail. In a first process of the method a substrate 300 is provided. The substrate 300 comprises a stack of layers. The substrate 300 comprises a first semiconductor layer 310 having at least a first carrier mobility enhancing parameter, a buried insulating layer 330 on the first semiconductor layer 310 and a second semiconductor layer 320 having at least a second carrier mobility enhancing parameter, the at least second carrier mobility enhancing parameter being different from the at least first carrier mobility enhancing parameter.

A carrier mobility enhancing parameter is defined as a characteristic of a semiconductor material which enables enhancement of the carrier mobility, more specifically which enhances the electron mobility in case of a n-type MUGFET (nMUGFET) or which enhances the hole mobility in case of a p-type MUGFET (pMUGFET). For example a (100)/<110> orientation/direction of a Si layer is beneficial for electron mobility in nMUGFET transistors (electron current in the <110> direction). The carrier mobility enhancing parameter of the semiconductor layer is thus the crystalline orientation/direction (in the example (100)/<110> orientation/direction). For another example SiGe is beneficial for hole mobility in pMUGFET transistors. The carrier mobility enhancing parameter is thus the choice of semiconductor material (in the example SiGe). For yet another example a compressively strained SiGe-layer is even more beneficial for hole mobility in pMUGFET transistors. The carrier mobility enhancing parameter can thus be a combination of the choice of semiconductor material (in the example SiGe) and stress (or also referred to as strain) (in the example compressive strained SiGe).

In one embodiment of the present invention the at least first carrier mobility enhancing parameter is a crystalline orientation/direction of the first semiconductor layer.

In another embodiment of the present invention the at least second carrier mobility enhancing parameter is a crystalline orientation/direction of the second semiconductor layer.

The at least first carrier mobility enhancing parameter of the first semiconductor layer may be a choice of semiconductor material of the first semiconductor layer, further referred to as the first semiconductor material (of the first semiconductor layer). The at least first carrier mobility enhancing parameter may also be a stress, either compressive or tensile, applied to the first semiconductor layer, further referred to as the first stress (of the first semiconductor layer). The at least first carrier mobility enhancing parameter may also comprise any combination of the first semiconductor material, the first crystalline orientation/direction and the first stress.

The at least second carrier mobility enhancing parameter of the second semiconductor layer may be a choice of semiconductor material of the second semiconductor layer, further referred to as the second semiconductor material (of the second semiconductor layer). The at least second carrier mobility enhancing parameter may also be a stress, either compressive or tensile, applied to the second semiconductor layer, further referred to as the second stress (of the second semiconductor layer). The at least second carrier mobility enhancing parameter may also comprise any combination of the second semiconductor material, the second crystalline orientation/direction and the second stress.

The at least first carrier mobility enhancing parameter is different from the at least second carrier mobility enhancing parameter. With different is meant that at least one of the first crystalline orientation/direction, or of the choice of first semiconductor material or of the first stress is different from at least one of the second crystalline orientation/direction, or of the choice of second semiconductor material or of the second stress respectively. If for example the carrier mobility enhancing parameter is a crystalline orientation/direction, the first crystalline orientation/direction is different from the second crystalline orientation/direction. For example the first semiconductor layer may comprise a Si(100)/<110> layer and the second semiconductor layer may for example comprise a Si(110)/<110> layer. With this example electrons will have increased mobility in the first semiconductor layer, which is beneficial for nMUGFET, while holes will have increased mobility in the second semiconductor layer, which is beneficial for pMUGFET. Such a substrate comprising at least two semiconductor layers with different crystalline orientations is also often referred to as a hybrid-orientation substrate, or hetero-orientation substrate or mixed-orientation substrate. If the carrier mobility enhancing parameter is a stress parameter, the first stress is different from the second stress. For example the first semiconductor layer may comprise tensile strained Si, which is beneficial for nMUGFET, while the second semiconductor layer may for example comprise compressively strained SiGe, which is beneficial for pMUGFET. Also the use of Si for the nMUGFET, which is beneficial for electrons mobility and the use of SiGe which is more beneficial for holes mobility (compared to the use of Si for the p-type transistor) may be regarded as two different carrier mobility enhancing parameters. An nMUGFET with tensile strained Si and a pMUGFET with compressively strained SiGe may comprise thus a combination of different carrier mobility enhancing parameters, namely the choice of appropriate semiconductor material and the appropriate stress.

According to embodiments described in the drawings of the present invention, the substrate 300 comprises a first semiconductor layer 310 comprising a first semiconductor material with a first crystalline orientation (first crystalline semiconductor material), a buried insulating layer 330 on the first semiconductor layer 310 and a second semiconductor layer 320 comprising a second semiconductor material with a second crystalline orientation (second crystalline semiconductor material) on the buried insulating layer 330. If the first semiconductor material and the second semiconductor material are the same material (for example both are Si), the second crystalline orientation is different from the first crystalline orientation.

According to embodiments, the substrate 300 comprises a first semiconductor layer 310 comprising a first semiconductor material with a first stress, a buried insulating layer 330 on the first semiconductor layer 310 and a second semiconductor layer 320 comprising a second semiconductor material with a second stress on the buried insulating layer 330. If the first semiconductor material and the second semiconductor material are the same material (for example both are Si), the first stress is different from the second stress.

The first semiconductor layer 310 may comprise any semiconductor material including, for example, Si, SiC, SiGe, Ge, C, SiGeC, InP, GaAs, as well as other compound semiconductor material. Additionally the first semiconductor layer 310 may be strained, unstrained or a combination of strained and unstrained layers.

The second semiconductor layer 320 may comprise any semiconductor material including, for example, Si, SiC, SiGe, Ge, C, SiGeC, InP, GaAs, as well as other compound semiconductor material. Additionally the second semiconductor layer 320 may be strained, unstrained or a combination of strained and unstrained layers. The second semiconductor material of the second semiconductor layer 310 may be the same as the first semiconductor material of the first semiconductor layer 320. In this case the carrier mobility enhancing parameter will not be the choice of semiconductor material but will be one of or a combination of the choice of crystalline orientation/direction and/or stress.

If the second semiconductor material of the second semiconductor layer is the same as the first semiconductor material, at least the first crystalline orientation/direction is different from the second crystalline orientation/direction or at least the first stress is different from the second stress. Alternatively the second semiconductor material of the second semiconductor layer may be different from the first semiconductor material of the first semiconductor layer.

The first semiconductor layer has a first crystalline orientation, for example, (100), (110) or (111). The first semiconductor layer has a first crystalline channel (or current) direction, for example, <100>, <110> or <111>.

The second semiconductor layer 320 has a second crystalline orientation, for example, (100), (110) or (111). The second semiconductor layer has a second crystalline channel (or current) direction, for example, <100>, <110> or <111>. The second crystalline orientation/direction (of the second semiconductor layer 320) may be different from the first crystalline orientation/direction (of the first semiconductor layer 310). According to embodiments of the present invention the first crystalline orientation/direction of the first semiconductor layer 310 and the second crystalline orientation/direction of the second semiconductor layer 320 may be the same. In this case the carrier mobility enhancing parameter will not be the crystalline orientation/direction but will be one of or a combination of the choice of semiconductor material or stress.

The first and second crystalline orientation/direction may be chosen depending on the first and second semiconductor material respectively or depending on the semiconductor device to be fabricated in the first and second semiconductor layer.

The first semiconductor layer 310 may for example be a handle wafer.

The second semiconductor layer 320 has a thickness in the range of 10 nm to 100 nm.

The first semiconductor layer 310 and the second semiconductor layer 320 are electrically isolated from each other by a buried insulating layer 330. The buried insulating layer may comprise any electrically isolating material such as for example, but not limited thereto, an oxide (f.e. SiO2), a nitride (f.e. SiN), an oxynitride (f.e. SiON), amorphous carbon (f.e. APF), a low-k dielectric. The buried insulating layer 330 in between the first semiconductor layer 310 and the second semiconductor layer 320 may have a variable thickness in the range of 5 nm to 500 nm, more typical in the range of 10 nm to 200 nm. The buried insulating layer may for example be a buried oxide layer (BOX), as typically used for semiconductor-on-insulator substrate, with a thickness in the range of 10 nm to 200 nm.

Different combinations are possible for the stack of layers of the substrate. The substrate may, for example, comprise an SOI substrate with a second crystalline orientation on a buried oxide layer (BOX) on a Si handle wafer with a first crystalline orientation. For example the Si handle wafer may comprise a layer of Si(100)/<110>. The SOI substrate may comprise a layer of Si(110)/<110>. Vice versa the bottom first semiconductor layer of the substrate may comprise Si(110)/<110> and the upper second semiconductor layer of the substrate may comprise Si(100)/<110>. For another example the Si handle wafer may comprise a layer of Si(100)/<100> (possibly with rotated notch). The SOI substrate may comprise a layer of Si(110)/<110>. Vice versa the bottom first semiconductor layer of the substrate may comprise Si(110)/<110> and the upper second semiconductor layer of the substrate may comprise Si(100)/<100> (possibly with rotated notch). In yet another example the Si handle wafer may comprise a layer of Si(100)/<100> (possibly with rotated notch). The SOI substrate may comprise a layer of Si(100)/<110>. Vice versa the bottom first semiconductor layer of the substrate may comprise Si(100)/<110> and the upper second semiconductor layer of the substrate may comprise Si(100)/<100> (possibly with rotated notch). The substrate may, for example comprise an semiconductor-on-insulating substrate with a second semiconductor material on a BOX on a semiconductor handle wafer with a first semiconductor material. The substrate may for example comprise an SGOI substrate on a buried oxide layer (BOX) on a Si handle wafer a first crystalline orientation. More specifically the Si handle wafer may comprise a layer of Si(100)/<110>. The SGOI substrate may comprise a layer of SiGe. Vice versa the bottom first semiconductor layer of the substrate may comprise SiGe and the upper second semiconductor layer of the substrate may comprise Si(100)/<110>. Alternatively the Si(100)/<110> layer may be replaced by a Si(100)/<100> layer with rotated notch. Alternatively the SiGe(110)/<110> layer may be replaced with a SiGe(110)/<100>. Alternatively SiC may be used in combination with a Si layer, since SiC gives better electron mobility (which is advantageous for nFET devices). Also SiC may be combined with SiGe to form a hybrid-orientation substrate. It should be understood that these possibilities are exemplary but not limiting and other combinations for the substrate according to embodiments of the present invention could be thought of by any person skilled in the art.

Providing the substrate 300, i.e. providing a first semiconductor layer 310 having at least a first carrier mobility enhancing parameter, a buried insulating layer 330 on the first semiconductor layer 310 and a second semiconductor layer 320 having at least a second carrier mobility enhancing parameter, the at least second carrier mobility enhancing parameter being different from the at least first carrier mobility enhancing parameter, i.e. more specifically by providing a first semiconductor layer 310 comprising a first semiconductor material with a first crystalline orientation (first crystalline semiconductor material), providing a buried insulating layer 330 on the first semiconductor layer 310 and providing a second semiconductor layer 320 comprising a second semiconductor material with a second crystalline orientation (second crystalline semiconductor material) on the buried insulating layer 330, may be formed by a layer-transfer technique through wafer bonding as also discussed in detail in a publication of Yang et al., IEEE Transactions on electron devices, Vol. 53(5), May 2006, which is incorporated herein by reference. With this technique an oxide layer is first grown on a first wafer. Next this first wafer is implanted with hydrogen ions to form a damage layer in the underlying semiconductor material. Then the hydrogen implanted first wafer is hydrophilically bonded at room temperature to a second wafer. This second wafer acts as a handle wafer. The first wafer is cut across the damage plane and/or further polished and thinned down to the desired thickness.

Thereby in the substrate 300 at least two separate regions 301, 302 are defined, at least a first (active) region 301 and at least a second (active) region 302, such as for example the first region 301 defining a nFINFET device, whereas the second region 302 defining a pFINFET device, or vice versa.

Figure 3A:
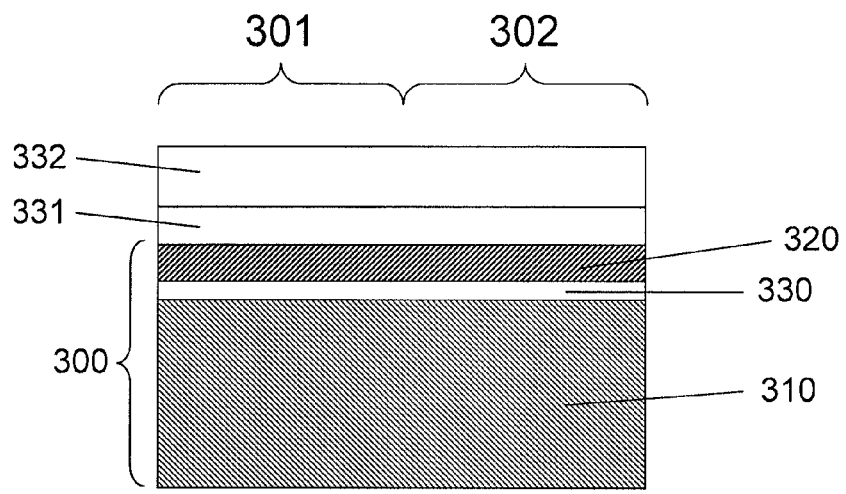
FIGS. 3A-3F are schematic representations of the different processes for fabricating a multi-gate device according to one embodiment.

In a next process, a first dielectric layer 331 is provided on the second semiconductor layer 320 (FIG. 3A). Onto the first dielectric layer 331 a second dielectric layer 332 is provided. The first and/or second dielectric layer may comprise an electrically isolating material such as for example, but not limited thereto, an oxide (for example SiO2), a nitride (for example SiN), a oxynitride (for example SiON), amorphous carbon (APF), a low-k dielectric. The first and/or second dielectric layer may be deposited using a deposition process such as, for example, chemical vapor deposition (CVD), atomic layer deposition (ALD), physical vapor deposition (PVD), liquid-phase deposition (LPD) or may be formed using thermal oxidation, nitridation or oxynitridation. The first and/or second dielectric layer may act as a hardmask or hardmask stack, used in further processes according to specific embodiments of the present invention to provide patterned structures, i.e. trenches in the underlying semiconductor and/or insulating layers. The thickness of the first dielectric layer is in the range of about 2 nm to 150 nm, in the range of about 2 nm to 10 nm, in the range of about 10 nm to 150 nm, in the range of about 50 nm to 150 nm. The thickness of the second dielectric layer is in the range of about 2 nm to 150 nm, in the range of about 2 nm to 10 nm, in the range of about 10 nm to 150 nm, in the range of about 50 nm to 150 nm. The thickness of the second dielectric layer will determine the height of the fins, i.e. the height protruding above the surface of the multi-gate device fabricated according to certain embodiments of the present invention. The height of the fins will be equal or smaller than the thickness of the second dielectric layer. Otherwise the fins will protrude or stick out above the substrate surface with a maximal height which is equal to the thickness of the second dielectric layer.

Figure 3B:
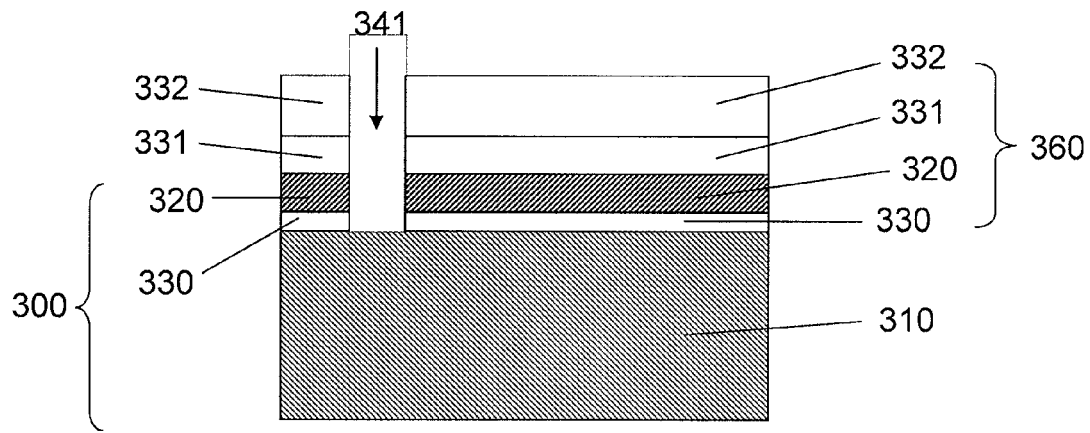

In a next process according to one embodiment of the present invention at least a first trench 341 is defined through a stack of layers 360 i.e. through the first dielectric layer 331, the second dielectric layer 332, the second semiconductor layer 320 and the buried insulating layer 330, as such exposing part of the first semiconductor layer. The first trench 341 comprises a sidewall (FIG. 3B). The at least first trench 341 is formed in the first region 301. The at least first trench 341 may be formed by patterning the substrate 300 including the first 331 and second 332 dielectric layer using lithography. Different possibilities are available for this patterning process. A resist layer (not shown) may, for example, be deposited on top of the stack 360. The photoresist is then exposed in a lithographic process and developed such that a pattern is formed into the photoresist. The pattern in the photoresist is then transferred to the underlying layer(s) by at least one etching process. The stack 360 of layers may be etched using one etching process. Alternatively the first 331 and/or second 332 dielectric layer may be etched in a first etching process. During another etching process the pattern formed in the first 331 and/or second 332 dielectric layer is transferred through the underlying layers, namely the second 320 semiconductor layer and the buried insulating layer 330. Depending on the materials of the different layers 330, 320, 331, 332, the different etching processes may use different etching chemistries, for example reactive-ion etching (RIE), plasma etching, or any other dry etching method as known for a person skilled in the art.

Any (deep) trench etch technology known for a person skilled in the art may be used for the formation of the at least first trench. The dimensions of the at least first trench define the dimensions of the at least first fin that will be formed in further processes according to certain embodiments of the present invention. The depth of the trenches fabricated according to certain embodiments of the present invention will depend on the thickness of the buried insulating layer 330, the thickness of the second semiconductor layer 320, the thickness of the first dielectric layer 331 and the thickness of the second dielectric layer 332. The at least first trench is about 19 nm to 900 nm deep and about 5 nm to 100 nm wide.

Figure 3C:
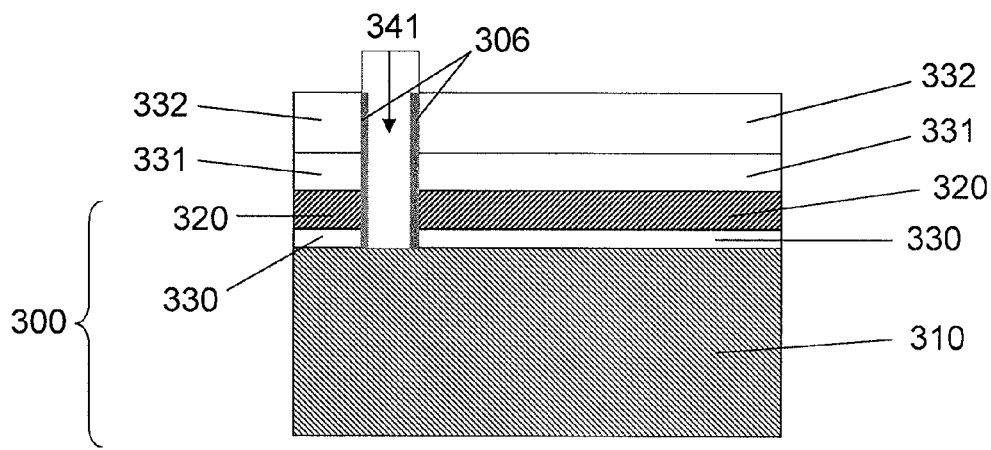

In a next process according to one embodiment of the present invention sidewalls of the at least first trench 341 are isolated from the second semiconductor layer 320 (FIG. 3C). In this way transistors manufactured in the first (active) region 301 will be electrically isolated from transistors manufactured in the second (active) region 302, assuring proper working of the multi-gate device. Otherwise the at least first fin in the first active region must be electrically isolated from the at least second fin in the second active region. In one embodiment the first region 301 is electrically isolated from the second region 302 by depositing an insulating layer 306 at the sidewalls of the at least first trench. Any dielectric material that may be formed at the sidewalls of the trench is suitable for electrically isolating the first region 301 from the second region 302, for example electrically isolating pFINFETs from nFINFETs. Preferably the dielectric material is a spacer material, such as nitride, for example SiN.

Figure 3D:
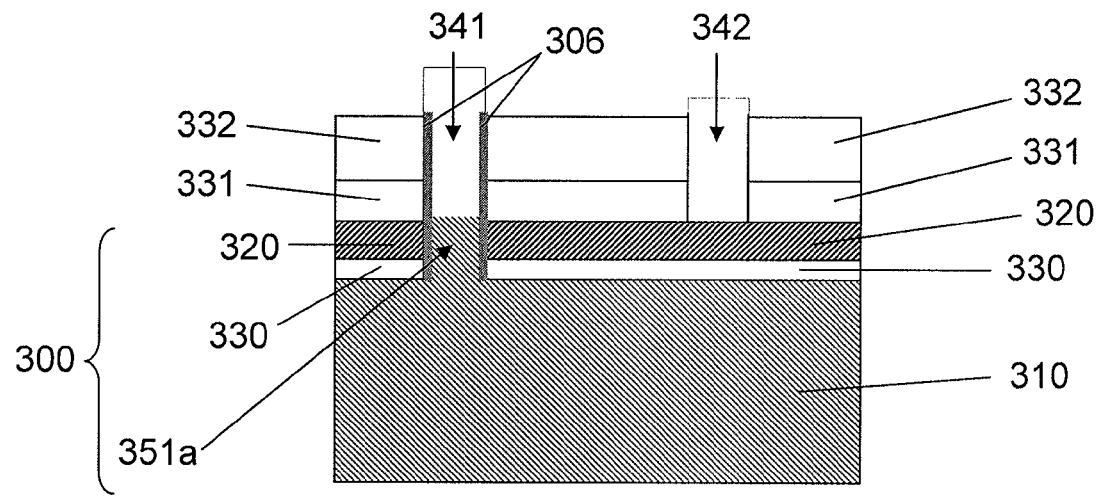
Figure 3E:
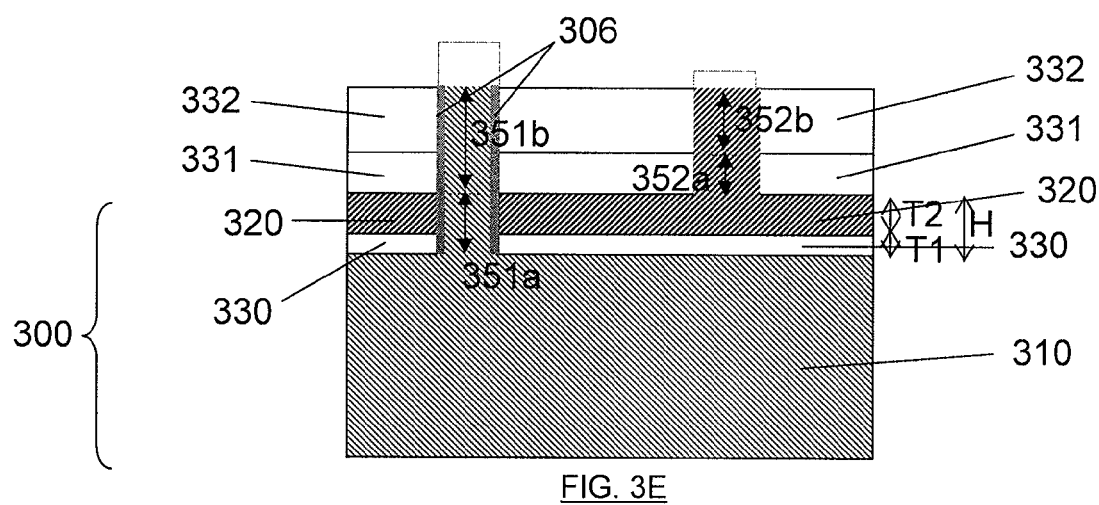
Figure 3F:
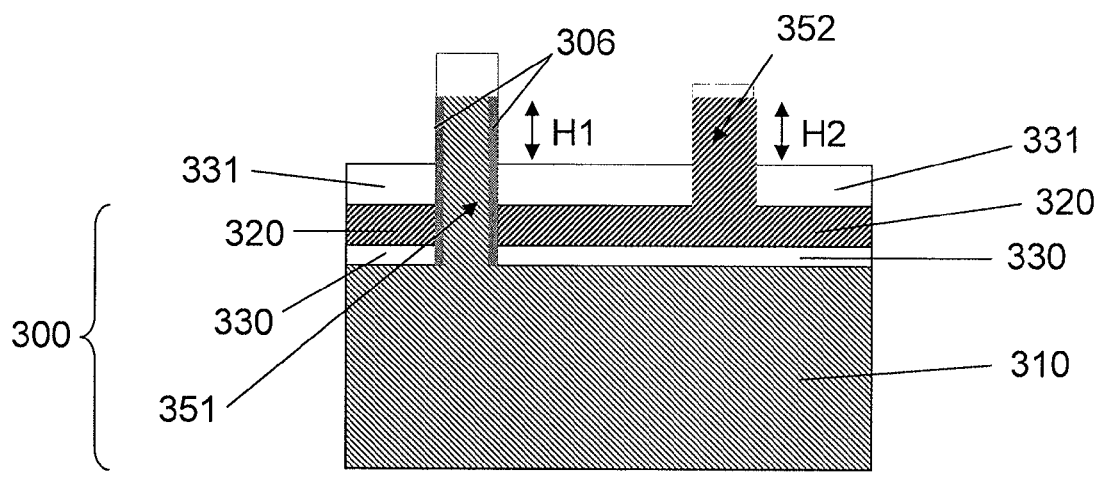

In a next process according to an embodiment of the present invention a first fin 351 is formed in the at least first trench 341, the first fin 351 protruding above the first dielectric layer 331, the first fin 351 having at least the first carrier mobility enhancing parameter. (FIGS. 3D, 3E, 3F). The first fin is grown in the at least first trench through the first dielectric layer 331 as such also protruding through the first dielectric layer.

The formation of the first fin 351 in the at least first trench 341 may comprise different processes. In an embodiment forming the first fin 351 comprises forming a first part 351a (also referred to as bottom part) and forming a second part 351b (also referred to as upper part) after the process of forming the first part 351a. In an embodiment forming the first fin 351 comprises filling the bottom part of the first trench 351a by epitaxially growing on the first semiconductor layer 310 a (bottom) semiconductor material having at least the first carrier mobility enhancing parameter. After the process of filling a bottom part of the first trench 351a the upper part of the at least first trench 351b may be further filled using epitaxial growth of another or the same (upper) semiconductor material on the bottom semiconductor material of the bottom part 351a. In an embodiment of the present invention the filling the upper part of the at least first trench is done simultaneously with the process of forming the second fin in the at least second trench.

In another embodiment the filling the upper part of the at least first trench 351b is done after the process of filling the bottom part of the first trench 351a and before the process of forming at the least second fin 352. In this case a mask 340 is provided on the at least first fin 351 before the process of forming the at least second fin 352 and the mask 340 is removed after the process of forming the at least second fin 352 (FIG. 4E).

Preferably the semiconductor material in the first part 351a and the second part 351b is the same as the first semiconductor material from the first semiconductor layer 310. Additionally the crystalline orientation of the semiconductor material grown in the first bottom part 351a and optionally the second upper part 351b in the at least first trench 341 is the same as the first crystalline orientation of the first semiconductor material from the first semiconductor layer 310. Additionally the stress, if present, of the semiconductor material in the first bottom part 351a and optionally the second upper part 351b may be the same as the stress in the first semiconductor material of the first semiconductor layer.

The first bottom part 351a and the second upper part 351b may be formed separately, i.e. in separate processes (FIGS. 3D,3E). The first bottom part 351a may be formed by epitaxially growing a semiconductor material in the at least first trench 341. Preferably the semiconductor material in the first bottom part 351a is the same as the first semiconductor material from the first semiconductor layer 310. Additionally the crystalline orientation of the semiconductor material grown in the first bottom part 351a in the at least first trench 341 is the same as the first crystalline orientation of the first semiconductor material from the first semiconductor layer 310. The first bottom part 351a may be formed up to the top surface of the second semiconductor layer 320. A height H of the first bottom part 351a can thus be defined as being the height in the first trench 341 up to which the first bottom part 351a of the first fin 351 is formed. The height H is larger than 0 nm. The height H is not larger than the sum of the thickness T1 of the buried insulating layer 330 and the thickness T2 of the first semiconductor layer 320.

The second upper part 351b in the at least first trench 341 is formed with another or the same semiconductor material in a later process. The later process of forming the second upper part 351b in the at least first trench 341 may occur simultaneously, according to one embodiment, with the formation of the at least second fin of the multi-gate device, more specifically with the formation of at least the bottom part of the at least second fin in the at least second trench (FIG. 3E).

Figure 4A:
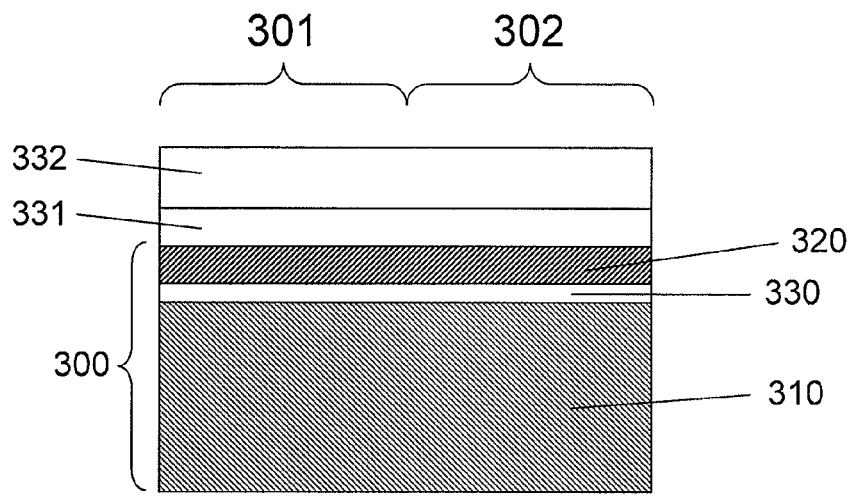
FIGS. 4A-4F are schematic representations of the different processes for fabricating a multi-gate device according to one embodiment.
Figure 4B:
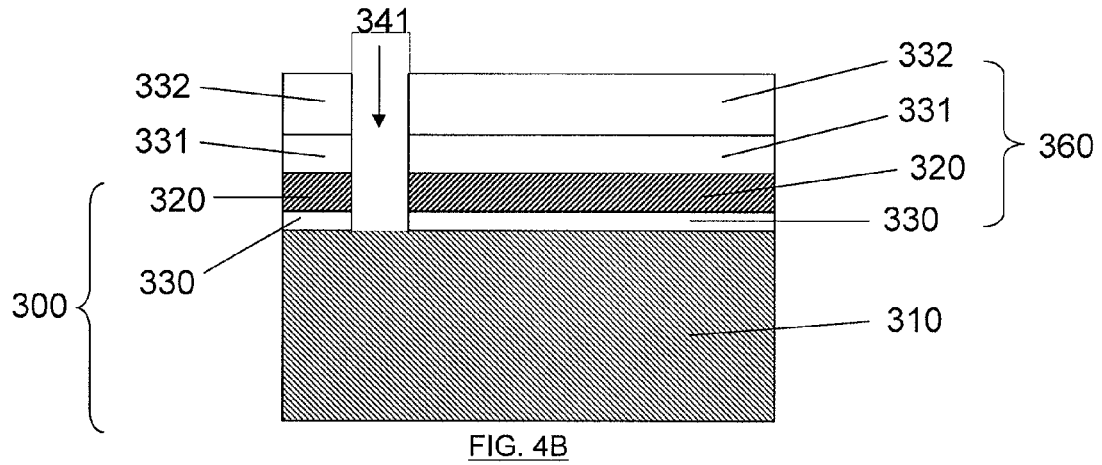
Figure 4C:
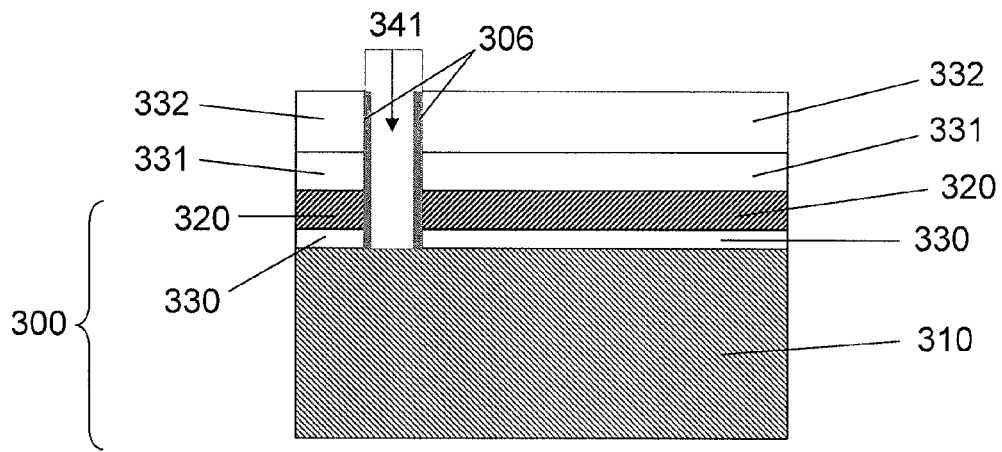
Figure 4D:
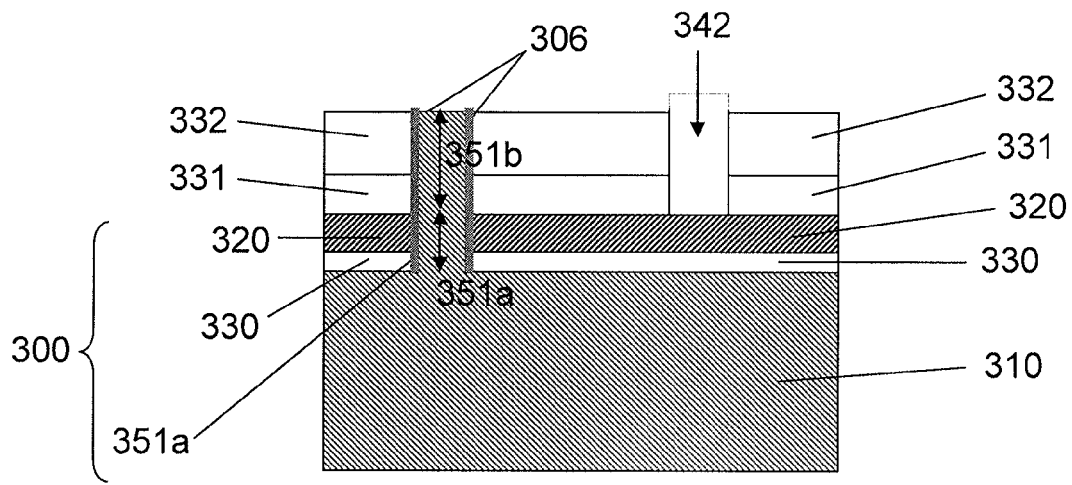
Figure 4E:
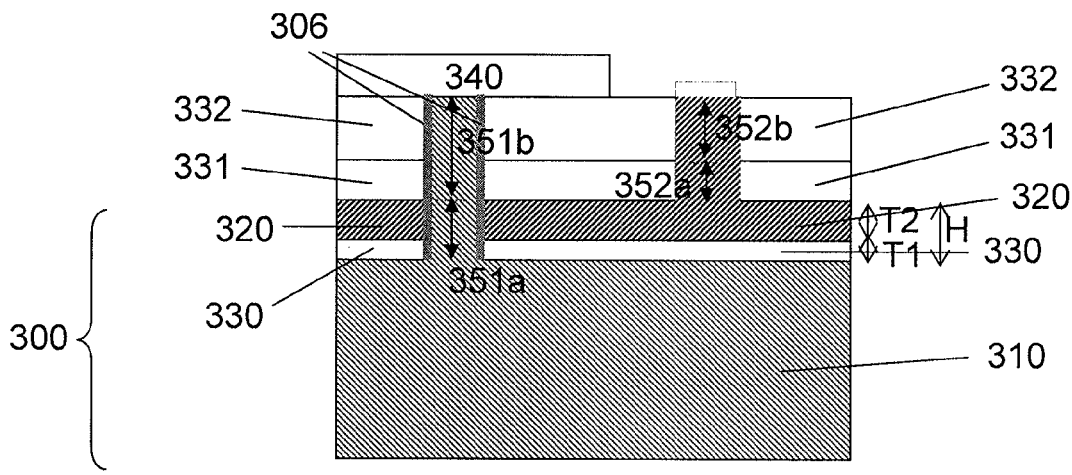
Figure 4F:
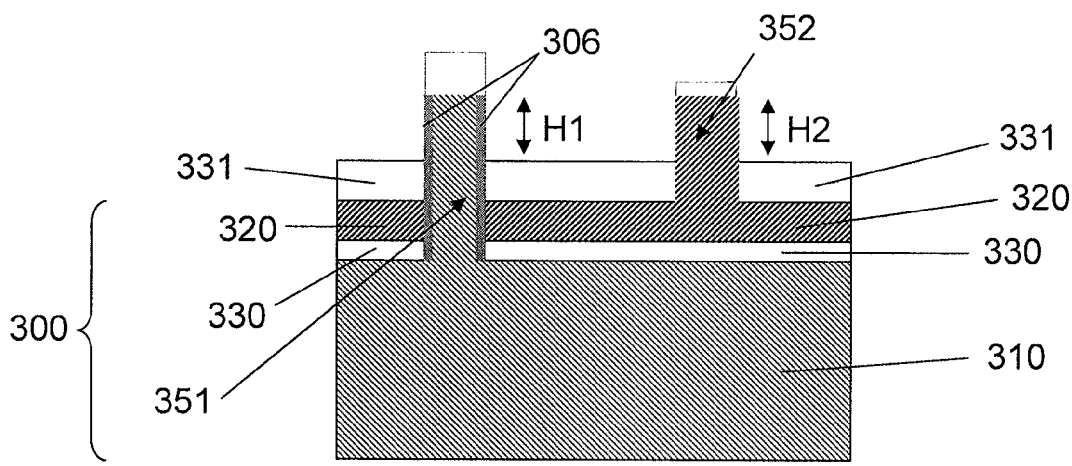

In another embodiment the first bottom part 351a and the second upper part 351b may be formed during the same process for example by epitaxially growing a semiconductor material in the at least first trench 341 (FIG. 4D). The semiconductor material is thus grown in one process (for example a epitaxial growth process) in the first trench 341 up to the top surface of the second dielectric material 332.

In a next process according to certain embodiments of the present invention at least a second trench is formed through the first dielectric layer and the second dielectric layer (FIG. 3D) in the second region 302. The at least second trench 342 may be formed by patterning the first 331 and second 332 dielectric layer using lithography. Different possibilities are available for this patterning process. A resist layer (not shown) may, for example, be deposited on top of the second dielectric layer 332. This photoresist is then exposed in a lithographic process and developed such that a pattern is formed into the photoresist. The pattern in the photoresist is then transferred to the underlying dielectric layers by at least one etching process. The first 331 and second 332 dielectric layer may be etched using one etching process. Alternatively the first 331 and/or second 332 dielectric layer may be etched in two separate etching processes depending on the material chosen for the dielectric layers. The different etching processes may use different etching chemistries, depending on the materials of layers 320, 331, 332, for example reactive-ion etching (RIE), plasma etching, or any other dry etching method known for a person skilled in the art. Any (deep) trench etch technology known for a person skilled in the art can be used for the formation of the at least second trench. The dimensions of the at least second trench define the dimensions of the fin that will be formed in further processes according to certain embodiments of the present invention. The at least second trench is about 4 nm to 300 nm deep and about 5 nm to 100 nm wide.

In a next process according to certain embodiments of the present invention a second fin is formed in the second trench, the second fin protruding above the first dielectric layer, the second fin having at least the second carrier mobility enhancing parameter. The second fin is formed in the second trench through the first dielectric layer as such also protruding through the first dielectric layer. In an embodiment the process of forming the second fin 352 comprises forming a first bottom part 352a and forming a second upper part 352b after the process of forming the first bottom part 351a. The first bottom part 352a and the second upper part 352b may be formed simultaneously by epitaxially growing a semiconductor material in the at least first trench 352. Preferably the semiconductor material in the first bottom part 352a and optionally the second upper part 352b is the same as the second semiconductor material from the second semiconductor layer 320. Additionally the crystalline orientation of the semiconductor material grown in the first bottom part 352a and optionally the second upper part 352b in the at least second trench 342 is the same as the second crystalline orientation of the second semiconductor material from the second semiconductor layer 320. Additionally the stress of the semiconductor material grown in the first bottom part 352a and optionally the second upper part 352b in the at least second trench 342 is the same as the stress of the second semiconductor material from the second semiconductor layer 320.

The first bottom part 352a and the second upper part 352b may be formed separately, i.e. in separate processes. The first bottom part 352a may be formed by epitaxially growing a semiconductor material in the at least second trench 342. Preferably the semiconductor material in the first part 352a is the same as the second semiconductor material from the second semiconductor layer 320. Additionally the crystalline orientation of the semiconductor material grown in the first bottom part 352a in the at least first trench 342 is the same as the first crystalline orientation of the first semiconductor material from the second semiconductor layer 320. Additionally the stress of the semiconductor material grown in the first bottom part 352a in the at least first trench 342 is the same as the stress of the second semiconductor material from the second semiconductor layer 320.

The second part 352b in the at least first trench 342 is formed with another or the same semiconductor material in a later process.

According to one embodiment of the present invention at least the first bottom part 352a of the second fin 352 may be formed simultaneously with the formation of the second upper part 351b of the first fin 351. The simultaneous formation of the first part 352a of the second fin 352 and of the second part 351b of the first fin 351 may be done by epitaxially growth for example by using chemical vapor deposition (CVD), vapor-phase epitaxy (VPE). In this process at least part of the first fin 351 is grown simultaneously with at least part of the second fin 352.

Depending on the height H (i.e. the height of the first bottom part 351a of the first trench 341), the height H1 of the first fin 351 formed in the at least first trench 341 in the first region 301 is equal or smaller than the height H2 of the second fin 352 formed in the at least second trench 342 in the second region 302. If the height H (i.e. the height of the first part 351a of the first fin 351) is smaller than the sum of the height T1 (i.e. the thickness of the buried insulating layer 330) and the height T2 (i.e. the thickness of the second semiconductor layer 320), the final height H1 of the first fin 351 will be smaller than the final height H2 of the second fin 352 after simultaneously forming the first and the second fin. If the height H (i.e. the height of the first part 351a of the first fin 351) is equal to the sum of the height T1 (i.e. the thickness of the buried insulating layer 330) and the height T2 (i.e. the thickness of the second semiconductor layer 320), the final height H1 of the first fin 351 will be equal to the final height H2 of the second fin 352 after simultaneously forming the first and the second fin. The final height H1 of the first fin 351 and the final height H2 of the second fin 352 may be equal. Alternatively the final height H1 of the first fin 351 and the final height H2 of the second fin 352 may be different. By choosing a different height of the first fin 351 and the second fin 352, the mobility of the fins may be improved. If the first fin 351 defines for example the fin of a nFINFET and the second fin 352 defines for example the fin of a pFINFET, mobility may be enhanced by choosing a larger height for the pFINFET (thus H2 larger than H1) since mobility may be maximized along the sidewall surfaces of the fin of the pFINFET. Additionally the width of the first trench 341 for the nFINFET device may be made wider compared to the width of the second trench 342 for the pFINFET device, to enhance the mobility of the nFINFET device, since mobility may be maximized along the top surface of the nFINFET device.

In another process according to embodiments of the present invention the second dielectric layer is removed to expose the first fin and the second fin (FIG. 3F). For a MUG-FET device the channel region protrudes above the surface. Therefore the second dielectric layer 332 is removed. This removal may be done by a selective etching process towards the first dielectric layer 331, for example RIE or wet etch. After the removal of the second dielectric layer 332, at least the first fin 351 and at least the second fin 352 protrude above the first dielectric layer.

Additionally the dimensions of the at least first trench 341 and the dimensions of the at least second trench 342 may be optimized in order to optimize the carrier mobility of the resulting fins 351,352 formed in the trenches 341,342. Depending on the crystalline orientation/direction of the first and second semiconductor material, the trench and thus the fin may manufactured tall and small, or may be manufactured short and wide.

In further processing a gate dielectric and gate electrode may be formed over the at least first and at least second fin using conventional methods as known for a person skilled in the art.

Figure 5:
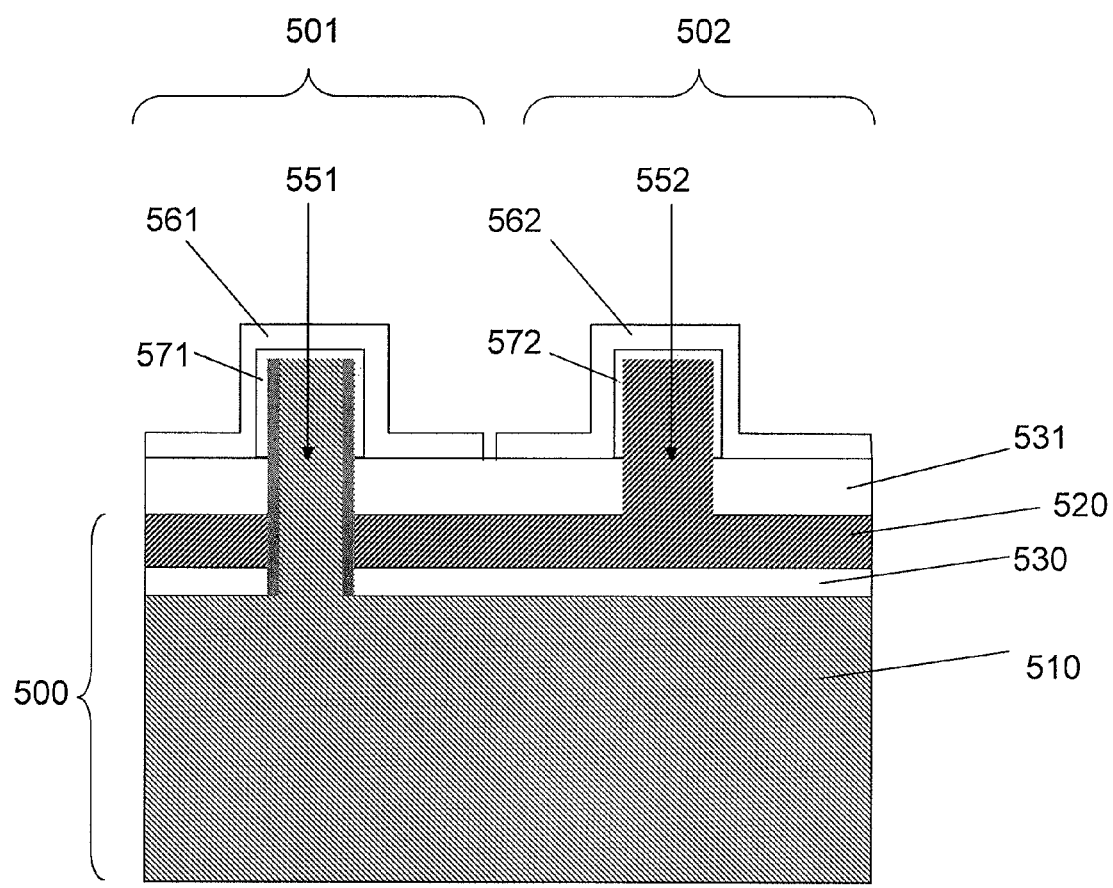
FIG. 5 is a schematic representation of a multi-gate device according to one embodiment.

In another aspect one embodiment of a multi-gate device is disclosed, the multi-gate device having improved carrier mobility by using different semiconductor layers for at least a first fin and at least a second fin of the multi-gate device (FIG. 5). The multi-gate device comprises a substrate 500. The substrate comprises a stack of layers, more specifically a first semiconductor layer 510 comprising a first semiconductor material with at least a first carrier mobility enhancing parameter, a buried insulating layer 530 on the first semiconductor layer, a second semiconductor layer 520 comprising a second semiconductor material with at least a second carrier mobility enhancing parameter on the buried insulating layer, the second carrier mobility enhancing parameter being different from the first carrier mobility enhancing parameter; a first active region 501 and a second active region 502 in the substrate, the first active region being electrically isolated from the second active region, wherein the first active region comprises at least a first fin 551, the first fin comprising at least the first semiconductor material; wherein the second active region comprises at least a second fin 552, the second fin comprising at least the second semiconductor material; a dielectric layer 531 atop of the second semiconductor layer 520, the dielectric layer 531 in between the at least first fin 551 and the at least second fin 552, the at least first fin 551 and the at least second fin 552 protruding above and through the dielectric layer 531; a gate oxide layer 571, 571 on each fin 551, 552; a gate electrode 561, 562 on the gate oxide layer 571, 572 for each fin 551, 552; and a source region and a drain region (not shown) in the active regions at sides of the gate electrode. The first fin grown on top and in contact with the first semiconductor layer and the second fin grown on top and in contact with the second semiconductor layer, In one embodiment the first carrier mobility enhancing parameter of the first semiconductor layer 510 is a specific crystalline orientation/direction of the semiconductor material and the second carrier mobility enhancing parameter of the second semiconductor layer 520 is another crystalline orientation/direction of the second semiconductor material.

In one embodiment the at least first fin 551 comprises a n-type first semiconductor material having a (100)/<110> surface direction/orientation, and wherein the at least second fin 552 comprises the p-type second semiconductor material having a (110)/<110> surface direction/orientation.

EXAMPLES

In an exemplary hybrid-oriented MUGFET device according to inventive aspects of the present invention the substrate comprises at least two semiconductor layers with different crystallographic direction/orientation. The first active region defines the nFET region, the second active region defines the pFET region. A first semiconductor layer may be, for example, a Si handle wafer with (100)/<110> orientation/channel direction. This crystallographic orientation is beneficial for electron mobility, i.e. for the nFINFET device. As nFINFET devices will be formed in the first region, the electron mobility of the at least one fin formed in this first region will have maximized electron mobility along the top surface of the fin. On top of the Si handle wafer an SOI substrate may be formed by example by using the layer-transfer technique using wafer bonding. The buried insulating layer may be a SiO$_2$ layer. The second semiconductor layer is for example a Si(110)/<110> layer. This crystallographic orientation is beneficial for hole mobility, i.e. for the pFINFET device. As pFINFET devices will be formed in the second region, the hole mobility of the at least one fin formed in this second region will have maximized hole mobility along the sidewall surfaces of the fin. On top of the second semiconductor layer, i.e. the SOI layer a first (oxide) and second dielectric (nitride) layer is formed. In a next process at least a first trench is formed in the nFET region. Preferably the first trench is formed by etching (RIE) through the stack of layers down to the Si handle wafer. In a next process nitride spacers are formed in the first trench to electrically isolate the first region from the second region. This may be done by LPCVD, RTCVD, ALD or PECVD In a next process at least part of the first trench is filled with semiconductor material, for example with Si. This growth may be done epitaxially. The grown Si will have the same crystallographic orientation as the Si handle wafer, i.e. (100)/<110>. In a next process at least a second trench is formed in the pFET region. Preferably the second trench is formed by etching through the first and second dielectric layer down to the second semiconductor layer, i.e. the Si(110)/<110> layer by RIE. After formation of the at least second trench, the remaining part of the first fin and the second fin are formed simultaneously. This may be done by growing Si into the trenches. In the first trench, the Si will take over the same crystalline orientation as the underlying Si, i.e. Si(100)/<110>. In the second trench, the Si will take over the same crystalline orientation as the underlying Si, i.e. Si(110)/<110>. Both fins are grown up to the top surface of the second dielectric layer. Otherwise the trenches are completely filled after this process. In a next process the second dielectric layer is removed by wet etching. After the process, as such, a Si(100)/<110> fin is formed in the first nFET region having improved electron mobility and a Si(110)/<110> fin is formed in the second pFET region. The Si(100)/<110> fin and the Si(110)/<110> fin are both protruding through and above the first dielectric layer. As electron mobility for a fin formed on Si(100)/<110> is optimal at the top surface of the fin, it may be preferential to make the first trench wider than the second trench, in order to have the first fin wider than the second fin. For the pFINFET made on Si(110)/<110> hole mobility will be optimal at the sidewall surfaces of the fin.

Alternatively one can also fill the second trench with SiGe. In this case compressive SiGe will be formed in the trench on the underlying Si(110)/<110> 320, enhancing hole mobility in the pFINFET. It is an advantage that hole mobility can be enhanced using SiGe in the channel region of the pFINFET device.

Alternatively one can start from a Si handle wafer with rotated notch, i.e. Si(100)/<100>. In this case the fin formed in the nFET region will comprise Si(100)/<100> which improves electron mobility at the sidewall surfaces of the fin. It is an advantage of this method that both trenches may be formed with the same width.

Alternatively the second semiconductor layer is for example a Si(100)/<110> layer. In this case when filling the trench with Si, the second fin will comprise Si(100)/<110> which is then beneficial for hole mobility at the top surface of the pFINFET. Therefore it would be advantageous to make the second trench wide such that a wide fin can be formed in the second trench having a large top surface area.

Alternatively one can start from a SiGe substrate for the first semiconductor layer 310 and Si may then be formed in the first trench. When forming Si on SiGe, the fin 351 formed in the first trench will include strained Si, which enhanced further electron mobility.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

What is claimed is:

1. A method of fabricating a multi-gate device comprising:
providing a substrate comprising a first semiconductor layer having at least a first carrier mobility enhancing parameter, a buried insulating layer on the first semiconductor layer, a second semiconductor layer having at least a second carrier mobility enhancing parameter on the buried insulating layer, wherein the first carrier mobility enhancing parameter comprises any of a first crystalline orientation or a first crystalline direction or a first semiconductor material or a first stress or a first combination thereof and wherein the second carrier mobility enhancing parameter comprises any of a second crystalline orientation or a second crystalline direction or a second semiconductor material or a second stress or a second combination thereof, the second carrier mobility enhancing parameter being different from the first carrier mobility enhancing parameter defining a first active region and a second active region in the substrate, the first active region being electrically isolated from the second active region;

providing a first dielectric layer on the substrate;

providing a second dielectric layer on the first dielectric layer;

forming in the first active region at least a first trench through the first dielectric layer, the second dielectric layer, the second semiconductor layer and the buried insulating layer;

forming a first fin in the at least first trench, the first fin protruding above the first dielectric layer, the first fin having at least the first carrier mobility enhancing parameter;

forming in the second active region at least a second trench through the first dielectric layer and the second dielectric layer;

forming a second fin in the at least second trench, the second fin protruding above the first dielectric layer, the second fin having at least the second mobility enhancing parameter; and removing the second dielectric layer to expose the first fin and the second fin.

2. The method of fabricating a multi-gate device according to claim 1, wherein the first or second crystalline orientation is chosen from (100), (110), (111).

3. The method of fabricating a multi-gate device according to claim 1, wherein the first or second crystalline direction is chosen from <100>, <110>, <111>.

4. The method of fabricating a multi-gate device according to claim 1, wherein the first active region is electrically isolated from the second active region by electrically isolating a sidewall of the first trench in the first active region from the second semiconductor layer in the second active region.

5. The method of fabricating a multi-gate device according to claim 1, wherein the isolating a sidewall of the first trench comprises depositing a dielectric material at the sidewall.

6. The method of fabricating a multi-gate device, according to claim 1, wherein the second dielectric layer has a thickness (T) such that the first fin protrudes above the first dielectric layer over a first height (H1) equal to or smaller than the thickness (T).

7. The method of fabricating a multi-gate device according to claim 1, wherein the second fin protrudes above the first dielectric layer over a second height (H2) equal to or smaller than the thickness (T).

8. The method of fabricating a multi-gate device according to claim 1, wherein the first height (H1) equals the second height (H2).

9. The method of fabricating a multi-gate device according to claim 1, wherein the forming of the first fin in the at least first trench further comprises filling a bottom part of the first trench by epitaxially growing on the first semiconductor layer a bottom semiconductor material having at least the first carrier mobility enhancing parameter.

10. The method of fabricating a multi-gate device according to claim 9, further comprising filling at least an upper part of the first trench by epitaxially growing on the bottom semiconductor material in the bottom part of the first trench an upper semiconductor material.

11. The method of fabricating a multi-gate device according to claim 1, wherein the f forming of the second fin in the at least second trench further comprises filling a bottom part of the second trench by epitaxially growing on the second semiconductor layer another bottom semiconductor material having at least the second carrier mobility enhancing parameter.

12. The method of fabricating a multi-gate device according to claim 11, further comprising filling an upper part of the second trench by epitaxially growing on the another bottom semiconductor material in the bottom part of the second trench another upper semiconductor material.

13. The method of fabricating a multi-gate device according to claim 10, wherein the filling of at least the bottom part of the second trench is done simultaneously with the filling of the upper part of the first trench.

14. The method of fabricating a multi-gate device according to claim 1, further comprising:

providing a mask on the at least first fin before the forming of the at least second fin; and removing the mask after the forming of the at least second fin.

15. A method of fabricating a multi-gate device comprising:

providing a first dielectric layer over a substrate and a second dielectric layer over the first dielectric layer, the substrate comprising:

a first semiconductor layer having at least a first carrier mobility enhancing parameter, an insulating layer over the first semiconductor layer, and a second semiconductor layer over the insulating layer, the second semiconductor layer having at least a second carrier mobility enhancing parameter different from the first carrier mobility enhancing parameter;

forming in a first active region of the substrate a first trench through the first dielectric layer, the second dielectric layer, the second semiconductor layer and the buried insulating layer;

forming a first fin in the first trench, the first fin protruding above the first dielectric layer, the first fin having at least the first carrier mobility enhancing parameter;

forming in a second active region a second trench through the first dielectric layer and the second dielectric layer;

forming a second fin in the second trench, the second fin protruding above the first dielectric layer, the second fin having at least the second mobility enhancing parameter; and removing the second dielectric layer to expose the first fin and the second fin.

16. The method according to claim 15, wherein each of the first and second carrier mobility enhancing parameter comprises any one or more of the following: a crystalline orientation, a crystalline direction, a semiconductor material, and a stress.

17. The method according to claim 15, wherein the first active region is electrically isolated from the second active region.

* * * * *